(12) United States Patent
Chang

(10) Patent No.: US 6,489,251 B2
(45) Date of Patent: Dec. 3, 2002

(54) METHOD OF FORMING A SLOPE LATERAL STRUCTURE

(75) Inventor: Ching-Yu Chang, Ilan (TW)

(73) Assignee: Macronix International Co., Ltd. (TW)

( * ) Notice: Subject to any disclaimer, the term of this patent is extended or adjusted under 35 U.S.C. 154(b) by 131 days.

(21) Appl. No.: 09/777,877

(22) Filed: Feb. 7, 2001

(65) Prior Publication Data

US 2002/0072242 A1 Jun. 13, 2002

(30) Foreign Application Priority Data

Dec. 13, 2000 (TW) ........................................ 89126643 A

(51) Int. Cl.[7] ............................................ H01L 21/302
(52) U.S. Cl. ........................ 438/745; 438/747; 438/750; 438/756; 438/757
(58) Field of Search ................................ 438/692, 695, 438/701, 745, 747, 750, 757, 756

(56) References Cited

U.S. PATENT DOCUMENTS 5,981,354 A * 11/1999 Spikes et al. ............... 438/424
6,040,232 A * 3/2000 Gau ............................ 438/424
6,048,775 A * 4/2000 Yao et al. .................... 438/424
6,069,056 A * 5/2000 Son et al. .................... 438/424
6,159,822 A * 12/2000 Yang et al. .................. 257/513
6,214,695 B1 * 4/2001 Inoue et al. ................. 438/424
6,403,496 B2 * 6/2002 Tien ............................ 438/745
6,429,136 B2 * 8/2002 Miwa .......................... 438/692

* cited by examiner

*Primary Examiner*—Robert Kunemund
*Assistant Examiner*—Binh X. Tran

(57) ABSTRACT

The present invention discloses a method of forming a slope lateral structure. In this invention, the silicon nitride and the silicon hydroxide with different etching rates are used. Thus, when the silicon nitride is etching, the top and laterals portion of the silicon hydroxide is suffering the slight etching. So that, when the silicon nitride is etched completely, a slope lateral silicon hydroxide is formed, because of the different etching time on the top and the bottom portion of the silicon hydroxide. Using the present invention, the conventional NROM process problem, which the wordlines are connected by the residue on the laterals of the protective layer after etching process can be solved.

22 Claims, 4 Drawing Sheets

METHOD OF FORMING A SLOPE LATERAL STRUCTURE

FIELD OF THE INVENTION

The present invention relates to a semiconductor etching method. More particularly, the present invention relates to the method of forming a slope lateral structure.

BACKGROUND OF THE INVENTION

A ROM is a nonvolatile memory device in which stored data are not changed in a normal operation state. A ROM is classified according to the methods for storing data into the ROM. There are a mask read only memory (MROM), a programmable ROM (PROM), an electrically programmable ROM (EPROM) and an erasable and electrically programmable ROM (EEPROM).

The mask ROM is coded with its data, i.e., has the data stored in it, by using a specialized mask (representing particular required for a user) during the fabrication process. Data stored in a mask ROM is not able to be changed, rather it is only possible to read the data. A type of mask ROM causes a predetermined transistor has a status that differs from other transistors by implanting impurity ions, so that a datum is coded. That is, the mask ROM causes a predetermined transistor to have an OFF state by implanting impurity ions during fabrication. Transistors for which impurity ions are not implanted during fabrication have an ON state, and vice versa. Therefore, the data are coded.

As illustrated in FIG. 1, a conventional mask ROM has a buried oxide layer 19 which is perpendicular to a wordline of gate 23. A high concentration buried diffusion region (buried diffusion region ) made of a common source and drain region and used for a bit line is formed under the buried oxide layer 19, so that the word line is perpendicular to the bit line. Accordingly, the word line and the bit line intersect and form transistors. First and second transistor channels 27 and 29 are formed between the buried diffusion regions under the buried oxide layer 19, overlapping with the gate 23. The transistor T1 having the first channel 27 that is coated with P conductivity type material maintains the OFF state, and the other transistor T2 having the uncoated second channel 29 is not programmed and maintains the ON state.

As illustrated in FIG. 2, a gate oxide layer 17 and a buried oxide layer 19 are formed on a P type semiconductor substrate 11. The buried oxide layer 19 is thicker than the gate oxide layer 17. A buried diffusion region 21 having N type impurity ions is formed under the buried oxide layer 19. The buried diffusion region 21 is the common source/drain of the transistors and used for a bit line. A gate 23, perpendicular to the buried diffusion region 21, is formed on the gate oxide layer 17. A portion of the semiconductor substrate 11, positioned opposite to the gate 23 becomes the first and second channels 27 and 29. The transistor T1 having the first channel 27 is made of the P type impurity ions and maintains the OFF state. The transistor T2 having the second channel 29 maintains the ON state.

A process for forming the above-described conventional mask ROM will now be described with reference to FIGS. 3A–3D.

As illustrated in FIG. 3A, a first photosensitive layer 13 is deposited on the semiconductor substrate 11 made of P type silicon. The photosensitive layer 13 is exposed to light, developed and patterned to expose selected portions of the semiconductor substrate 11. An N type impurity ion such as As or P is heavily doped in the semiconductor substrate 11, using the first photosensitive layer 13 as a mask, to form an ion implanted region 15.

As illustrated in FIG. 3B, the first photosensitive layer 13 is eliminated. The surface of the semiconductor substrate 11 is implanted with impurities during a thermal oxidation process, and the gate oxide layer 17 is formed on a portion where ions are not implanted. The rate of oxidation in the portion of the semiconductor substrate 11 where the ion implanted region 15 is formed is 1 to 2 times faster than that of the portion where ions are not implanted due to a lattice damage, enabling the formation of a thick buried oxide layer 19. During thermal oxidation, impurity ions in the ion implanted region 15 are activated, so that their function as the common source and drain region. The buried diffusion region 21 is used for the bit line.

As illustrated in FIG. 3C, impurity ions such as polycrystal silicon or CoSi are doped on the gate oxide layer 17 and the buried oxide layer 19 using chemical vapor deposition (CVD). They are patterned to be perpendicular to the buried diffusion region 21 in a photolithography method, effectively forming a wordline gate 23. Therefore, there is formed the transistor whose channel is the portion corresponding to the gate 23 between the buried diffusion regions 21 of the semiconductor substrate 11. The second photosensitive layer 24 is deposited on the overall surface of the substrate, exposed to light, developed and patterned to expose the predetermined transistor. Impurity ions such as B or $BF_2$ are heavily implanted in the substrate to form the ion implanted region 25, using the second photosensitive layer 24 as a mask.

As illustrated in FIG. 3D, the second photosensitive layer 24 is eliminated. The impurity ions in the ion implanted region 25 are heat-treated and diffused to form the first channel 27, where P type impurity ions are heavily doped. The channel where the P type impurity ions are not doped becomes the second channel 29. The transistor T1 that is used for the first channel 27 is coded, and the other transistor T2 that is used for the second channel 29 is not coded.

The process for forming the conventional mask ROM is described above. In order to efficiently protect the buried diffusion region 21 in the process of implanted B or $BF_2$ ion, a new process to prevent the coded failure, which is caused by the wider pattern of second photosensitive layer or error alignment is provided. A protective layer 35 is formed on the buried diffusion region 21 to replace the conventional buried oxide layer. As illustrated in FIG. 4.

However, the protective layer 35 can protect the buried diffusion region 21, but a big problem of forming the wordline gate 23 in the subsequence process is happened. The structure of the protective layer 35 has vertical laterals, so that the residue of polycrystal silicon or CoSi is formed on the vertical laterals after etching the wordline process. Due to the incomplete etching process, the wordlines are connected by the residue formed on the laterals of the protective layer, and the characters of the MROM are affected.

SUMMARY OF THE INVENTION

It is therefore an objective of this invention to provide a method of forming a slope lateral structure. In this invention, the silicon nitride and the silicon hydroxide with different etching rates are used. Thus, when the silicon nitride is etching, the top and laterals portions of the silicon hydroxide is suffering the slight etching. So that, when the silicon nitride is etched completely, a slope lateral silicon hydroxide is formed, because of the different etching time on the top and the bottom of the silicon hydroxide.

It is another objective of this invention to provide a method of forming a slope lateral structure. Using the present invention, the conventional NROM process problem, which the wordlines are connected by the residue on the laterals of the protective layer after etching process can be solved.

In accordance with the foregoing and other objects of this invention, this invention provides a method of forming a slope lateral structure during NROM fabrication process, comprising the steps of: providing a semiconductor substrate; forming a silicon nitride layer on the substrate, and then developing and patterning the silicon nitride layer to expose a plurality of selected portions of the semiconductor substrate; forming a silicon hydroxide layer overlaying the silicon nitride layer and the semiconductor substrate; polishing a surface of the silicon hydroxide layer to expose the silicon nitride layer and the silicon hydroxide layer; an etching process using an etching solution to etch the silicon nitride layer and the silicon hydroxide layer simultaneously, and then to form a residue of the silicon hydroxide layer on the semiconductor substrate after the etching process.

In accordance with the foregoing and other objects of this invention, this invention provides a method of forming a slope lateral structure, comprising the steps of: providing a semiconductor substrate; forming a first etching layer on the substrate, and then developing and patterning the first etching layer to expose a plurality of selected portions of the semiconductor substrate; forming a second etching layer overlaying the first etching layer and the semiconductor substrate; polishing a top portion of the second etching layer to expose the first etching layer and the second etching layer; an etching process using an etching solution to etch the first etching layer and the second etching layer simultaneously, and then to form a residue from one of the first etching layer and the second etching layer on the semiconductor substrate after the etching process.

BRIEF DESCRIPTION OF THE DRAWINGS

The invention will be more fully understood from the detailed description given herein below and the accompanying drawing, which are given by way of illustration only, and thus do not limit the present invention, and wherein.

DETAILED DESCRIPTION OF THE PREFERRED EMBODIMENT

Figure 1:
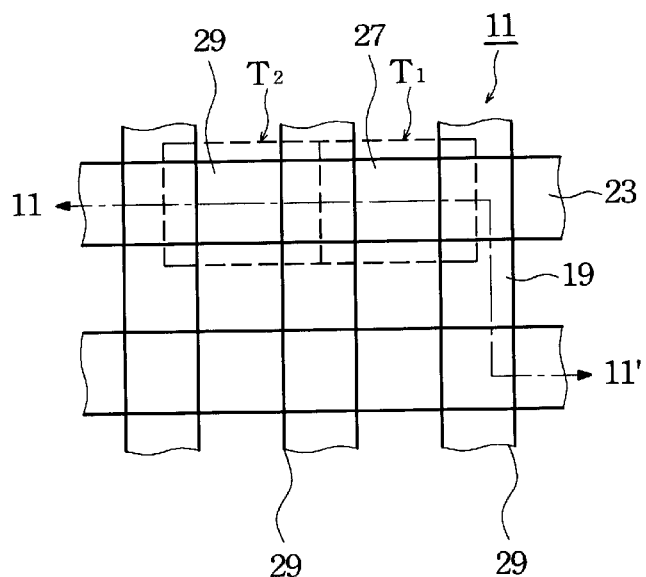
FIG. 1 is a top view of a conventional mask ROM.
Figure 2:
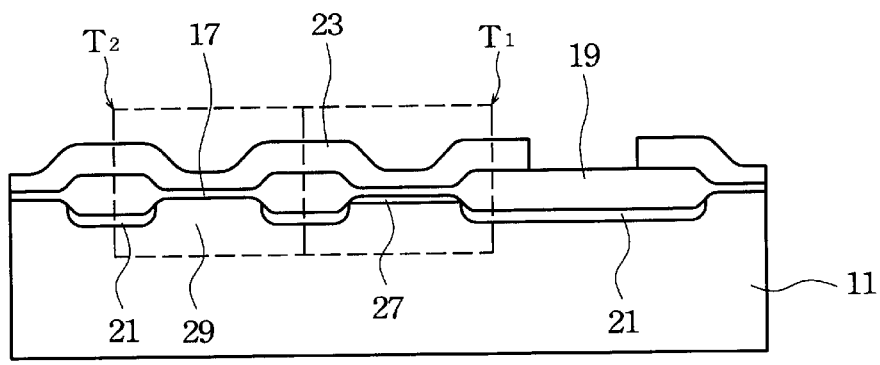
FIG. 2 is a sectional view taken along line II–II' of FIG. 1.
Figure 3:
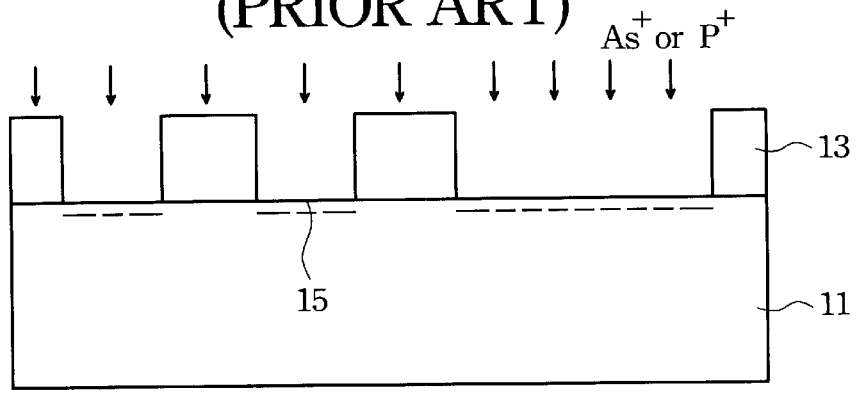
FIGS. 3A to 3D illustrate the fabricational procedures of a conventional MROM.
Figure 3:
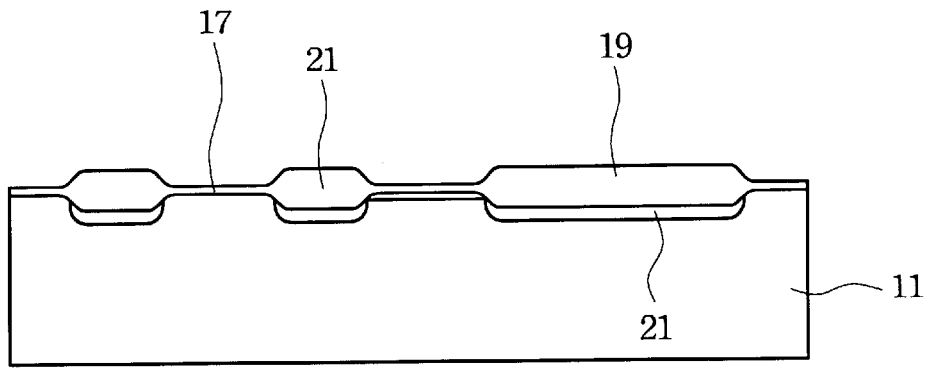
Figure 3:
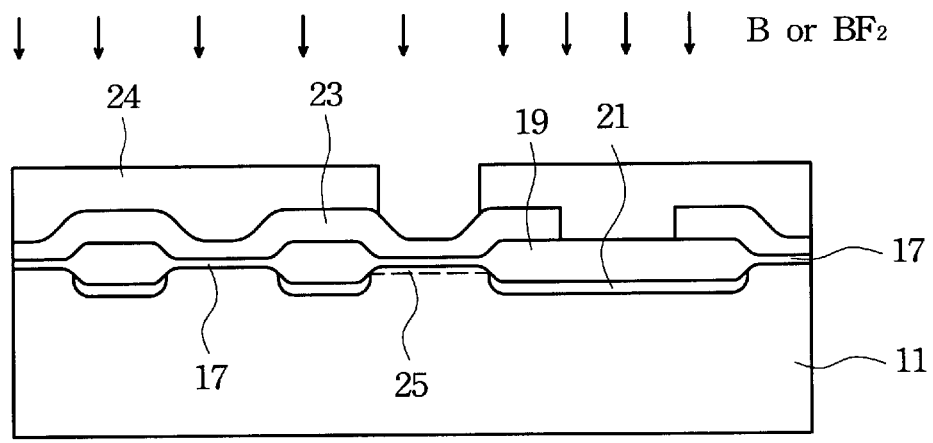
Figure 3:
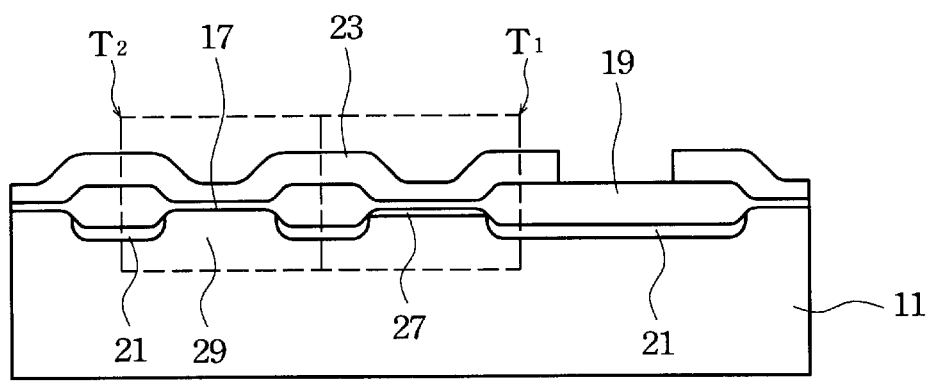
Figure 4:
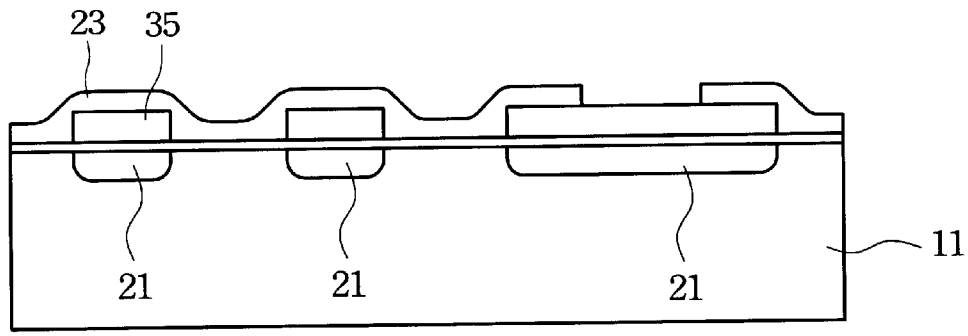
FIG. 4 is a sectional view of using a protective layer to protect the buried diffusion regions.

Reference will now be made in detail to the present preferred embodiments of the invention, examples of which are illustrated in the accompanying drawings. Wherever possible, the same reference numbers are used in the drawings and the description to refer to the same or like parts.

Figure 5:
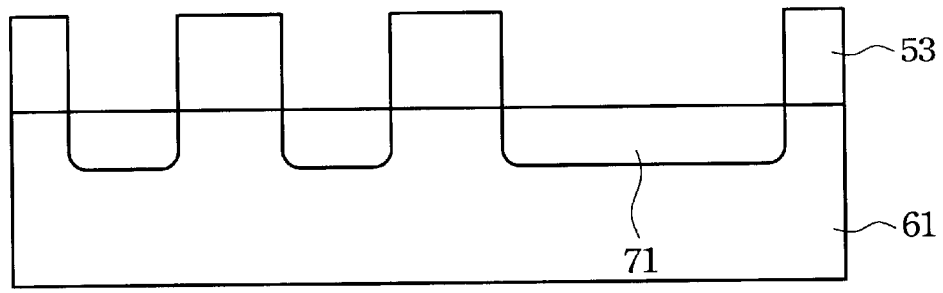
FIGS. 5A to 5D illustrate the fabricational procedures of MROM of the present invention.
Figure 5:
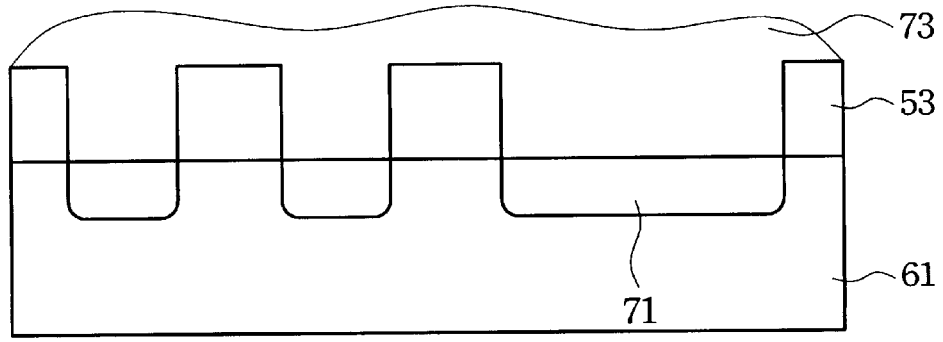
Figure 5:
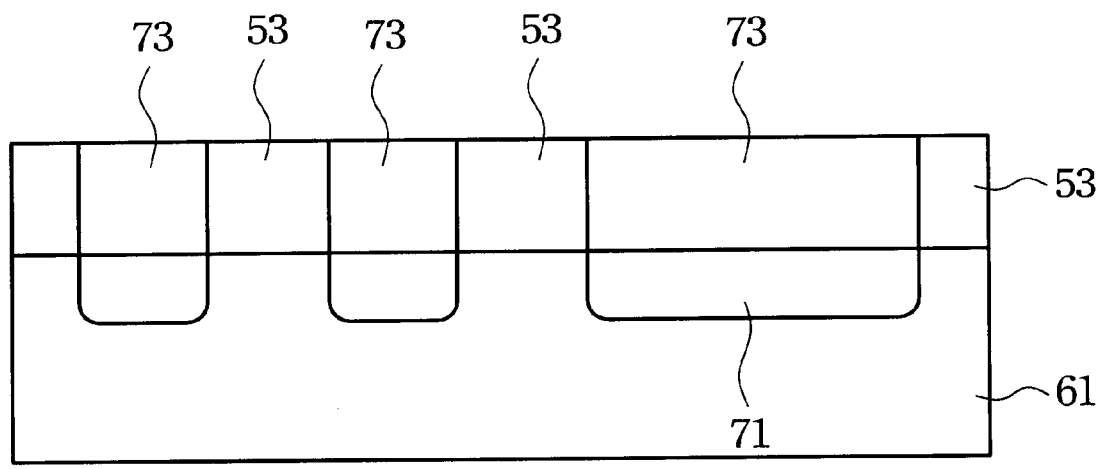
Figure 5:
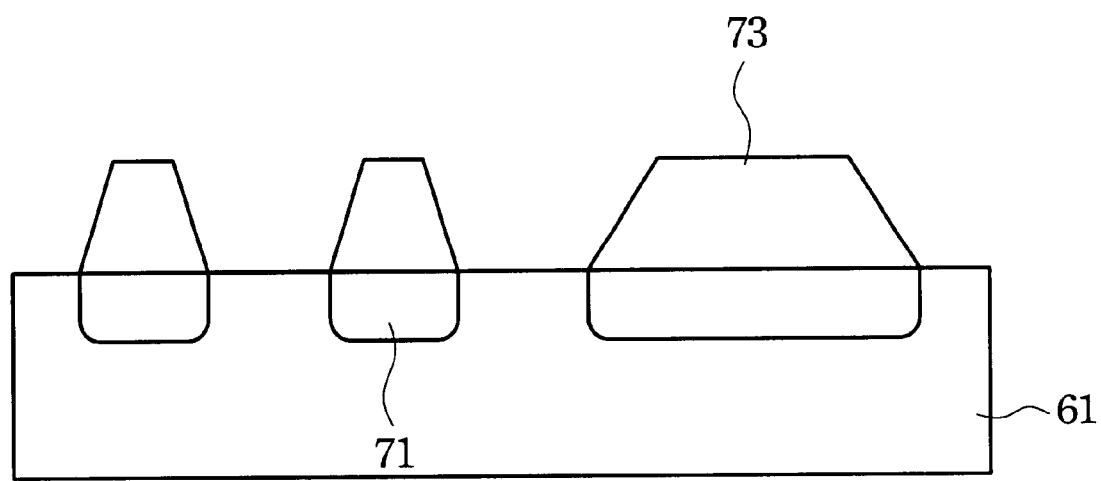

As illustrated in FIG. 5A, the conventional first photosensitive layer is replaced by a silicon nitride layer 53 to deposit on the semiconductor substrate 61 made of P type silicon. Using a photolithography method to expose selected portions of the semiconductor substrate 61. An N type impurity ion such as As or P is heavily doped in the semiconductor substrate 61, using the silicon nitride layer 53 as a mask, to form the buried diffusion regions 71.

As illustrated in FIG. 5B, in order to protect the buried diffusion regions 71, a silicon hydroxide layer 73 or a oxidation layer is deposited overlaying the silicon nitride layer 53 and the semiconductor substrate 61 by a chemical vapor deposition method.

As illustrated in FIG. 5C, using a chemical-mechanical polishing (CMP) method to eliminate the top portion of the silicon hydroxide layer. So that the silicon nitride layer and the silicon hydroxide layer are exposed regularly after the CMP method.

As illustrated in FIG. 5D, according to the embodiment of the present invention, the etching rate of the silicon nitride layer and the silicon hydroxide layer are different from each other under the condition of the $H_3PO_4$ as the etching solution and 160° C. as the process temperature. Accordingly, the etching rate of the silicon nitride layer is about between 45 and 60 angstrom/min. The silicon hydroxide layer is about between 1 and 30 angstrom/min, which depends on the different ratio of azote and oxygen. The oxidation layer is about between 0 and 1 angstrom/min. It is obvious that using the $H_3PO_4$ solution to etch the silicon nitride layer and the silicon hydroxide layer simultaneously would cause the residue of the silicon hydroxide layer on the semiconductor substrate after performing of the etching process. Thus, when the silicon nitride is etching, the top and lateral portions of the silicon hydroxide is suffering the slight etching. After the silicon nitride layer is etched, a slope lateral silicon hydroxide is formed, because of the different etching time on the top and the bottom portions of the silicon hydroxide.

According to the process described above, the slope lateral silicon hydroxide is formed. The buried diffusion regions can be protected efficiently, and the disadvantage that occurred during the process of forming the wordline gate in the subsequence process is also solved.

The conventional NROM process problem, which the wordlines are connected by the residue on the laterals of the protective layer after etching process can be solved. The structure of the present invention has slope laterals, so that the residue of polycrystal silicon or CoSi formed on the vertical laterals after etching the wordline process can be avoided.

To sum up, it is therefore an advantage of this invention to provide a method of forming a slope lateral structure. In this invention, the silicon nitride and the silicon hydroxide with the different etching rates are used. Thus, when the silicon nitride is etching, the top and lateral portions of the silicon hydroxide is suffering the slight etching. So that, when the silicon nitride is etched completely, a slope lateral silicon hydroxide is formed, because of the different etching time on the top and the bottom of the silicon hydroxide.

It is another advantage of this invention to provide a method of forming a slope lateral structure. Using the present invention, the conventional NROM process problem, which the wordlines are connected by the residue on the laterals of the protective layer after etching process can be solved.

While the preferred embodiment of the invention has been illustrated and described, it will be appreciated that various changes can be made therein without departing from the spirit and scope of the invention.

What is claimed is:

1. A method of forming a slope lateral structure during NROM fabrication process, comprising:

providing a semiconductor substrate;

forming a silicon nitride layer on said substrate;

developing and patterning said silicon nitride to expose a plurality of selected portions of said semiconductor substrate;

forming a silicon hydroxide layer overlaying said silicon nitride layer and said semiconductor substrate;

polishing a top portion of said silicon hydroxide layer to expose said silicon nitride layer and said silicon hydroxide layer; and performing an etching process using an etching solution to etch said silicon nitride layer and said silicon hydroxide layer simultaneously, and then to form a residue of said silicon hydroxide layer on said semiconductor substrate after said etching process.

2. The method according to claim 1, wherein said semiconductor substrate is a p type semiconductor substrate.

3. The method according to claim 1, wherein said step of developing and patterning to expose said plurality of selected portions of said semiconductor substrate includes the use of a photolithography method.

4. The method according to claim 1, wherein said step of polishing said surface of said silicon hydroxide layer includes the use of a chemical-mechanical polishing (CMP) process.

5. The method according to claim 1, wherein an etching rate of said silicon nitride layer is faster then said etching rate of said silicon hydroxide layer during said step of an etching process.

6. The method according to claim 1, wherein said etching solution is a $H_3PO_4$ solution.

7. The method according to claim 6, wherein a process temperature of said etching process is 160° C.

8. The method according to claim 7, wherein an etching rate of said silicon hydroxide layer is about between 1 and 30 angstrom/min.

9. The method according to claim 7, wherein an etching rate of silicon nitride is about between 45 to 60 angstrom/min.

10. A method of forming a slope lateral structure, comprising the steps of:

providing a semiconductor substrate;

forming a first etching layer on said substrate;

developing and patterning said first etching layer to expose a plurality of selected portions of said semiconductor substrate;

forming a second etching layer overlaying said first etching layer and said semiconductor substrate;

polishing a top portion of said second etching layer to expose said first etching layer and said second etching layer; and performing an etching process using an etching solution to etch said first etching layer and said second etching layer simultaneously, and then to form a residue from one of said first etching layer and said second etching layer on said semiconductor substrate after said etching process.

11. The method according to claim 10, wherein said semiconductor substrate is a p type semiconductor substrate.

12. The method according to claim 10, wherein said step of developing and patterning to expose said plurality of selected portions of said semiconductor substrate include the use of a photolithography method.

13. The method according to claim 10, wherein said step of polishing a surface of said second etching layer include the use of a chemical-mechanical polishing (CMP) process.

14. The method according to claim 10, wherein an etching rate of said first etching layer is faster then said etching rate of said second etching layer during said step of an etching process.

15. The method according to claim 10, wherein said etching solution is a $H_3PO_4$ solution.

16. The method according to claim 15, wherein a process temperature of said etching process is 160° C.

17. The method according to claim 16, wherein said first etching layer is a silicon nitride layer.

18. The method according to claim 17, wherein an etching rate of said silicon nitride layer is about between 45 and 60 angstrom/min.

19. The method according to claim 16, wherein said second etching layer is a silicon hydroxide layer.

20. The method according to claim 19, wherein an etching rate of said silicon hydroxide layer is about between 1 and 30 angstrom/min.

21. The method according to claim 16, wherein said second etching layer is an oxidation layer.

22. The method according to claim 21, wherein an etching rate of said oxidation layer is about between 0 and 1 angstrom/min.

* * * * *